US006362116B1

(12) United States Patent
Lansford (10) Patent No.: US 6,362,116 B1
(45) Date of Patent: Mar. 26, 2002

(54) METHOD FOR CONTROLLING PHOTORESIST BAKING PROCESSES

(75) Inventor: Jeremy Lansford, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/500,727

(22) Filed: Feb. 9, 2000

(51) Int. Cl.[7] .............................................. H01L 21/31
(52) U.S. Cl. ...................... 438/781; 438/778; 438/780
(58) Field of Search ................................. 438/778, 780, 438/781, 942, 948, 949; 73/627, 628, 629, 597

(56) References Cited

U.S. PATENT DOCUMENTS

| 4,977,330 A | * 12/1990 | Batchelder et al. .... 250/559.27 |
| 5,352,326 A | * 10/1994 | Cywar et al. ............... 430/323 |
| 6,026,688 A | * 2/2000 | Khuri-Yakub et al. ........ 73/597 |
| 6,127,098 A | * 10/2000 | Nakagawa et al. ......... 430/315 |

FOREIGN PATENT DOCUMENTS

JP    08 304033 A    11/1996

OTHER PUBLICATIONS

Thomas E. Metz et al. "In–situ Film Thickness Measurements for Real–Time Monitoring and Control of Advanced Photoresist Track Coating Systems", SPIE vol. 1594, 1991, pp. 146–152.*

Takeshi et al. (JP 08–304033), Translation.*

Croffie E et al., "Overview of the Storm Program Application to 193 nm Single Layer Resists" Microelectronic Engineering, vol. 53, No. 1–4, Jun. 1–30, 2000, pp. 437–442, XP001001580 p. 437, paragraph 1—p. 442, col. 2, paragraph 1.

International Search Report dated Jul. 18, 2001 (PCT/US 01/01524; TT3301–PCT).

* cited by examiner

Primary Examiner—Wael Fahmy
Assistant Examiner—Maria Guerrero
(74) Attorney, Agent, or Firm—Williams, Morgan & Amerson (57) ABSTRACT

A method and apparatus for controlling photoresist baking processes. A wafer is provided with the wafer having a layer of photoresist thereon. A first thickness of the photoresist layer is measured, and a first fourier transform infrared (FTIR) spectra of the photoresist layer is generated. Based on the first thickness and first FTIR spectra, a bake time and bake temperature is determined. The wafer is then baked at the bake temperature for the bake time.

8 Claims, 6 Drawing Sheets

METHOD FOR CONTROLLING PHOTORESIST BAKING PROCESSES

BACKGROUND OF THE INVENTION

1. Field of the Invention

This invention relates generally to wafer fabrication processes, and, more particularly, to a method and apparatus for controlling a photoresist baking process of a wafer during fabrication thereof.

2. Description of the Related Art

Conventionally, semiconductor devices are patterned using photolithographic processes. A base material, such as a substrate material, a metal, an insulator, etc., is coated with a light sensitive material, referred to as photoresist. The photoresist is generally sensitive to active rays of light, such as ultraviolet rays, X-rays or electron rays. The photoresist is deposited on the base material to selectively protect non-process portions of the substrate. Light is then selectively directed onto the photoresist film through a photomask, or reticle, to form photoresist patterns on the base material. The photoresist is then developed to remove either the exposed photoresist or the unexposed photoresist.

There are generally two types of photoresist, namely a positive type and a negative type. The positive photoresist is the type where the exposed portion dissolves in the developer, while the unexposed portion does not dissolve. The negative photoresist, on the other hand, is of the opposite type. Certain photoresist materials do not complete the transition from being soluble to being insoluble in the developer based solely on the exposure to light. These photoresist materials, referred to as chemically-amplified photoresists, are subjected to a post exposure bake process to complete the transition from soluble to insoluble (i.e., for a positive resist).

Figure 1A:
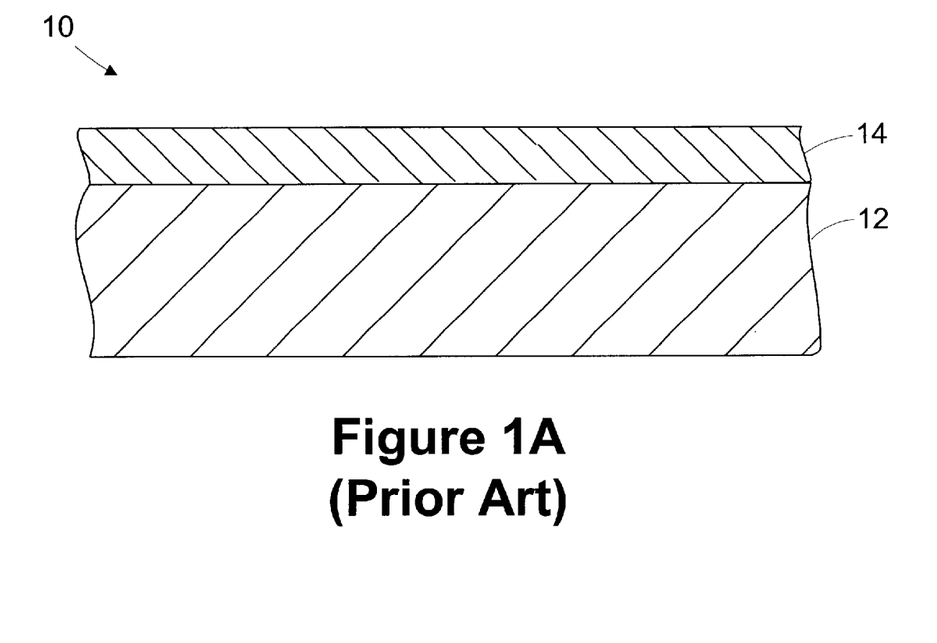
FIG. 1A is a cross-sectional view of a prior art substrate with a layer of photoresist formed thereon.
Figure 1B:
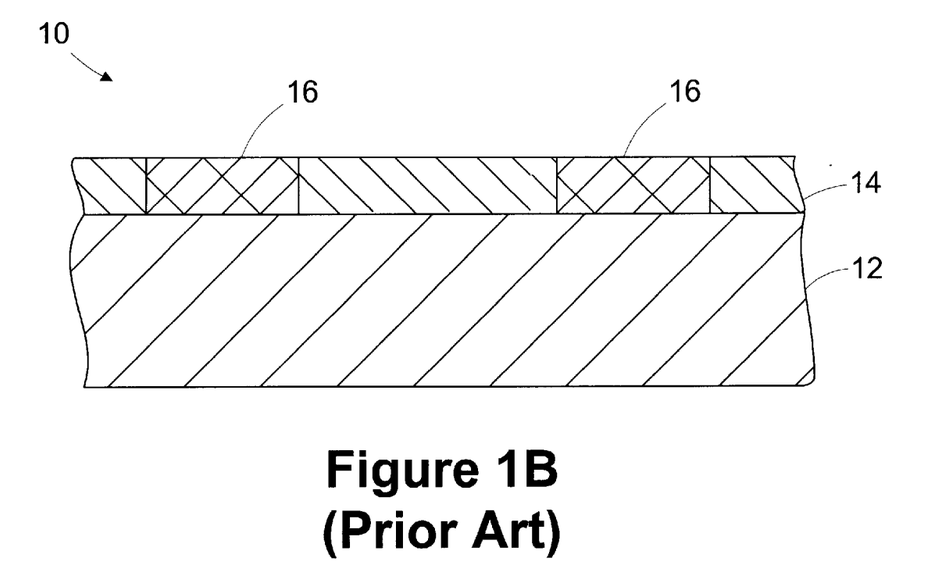
FIG. 1B is a cross-sectional view of the substrate of FIG. 1A after the photoresist has been exposed to a light source.
Figure 1C:
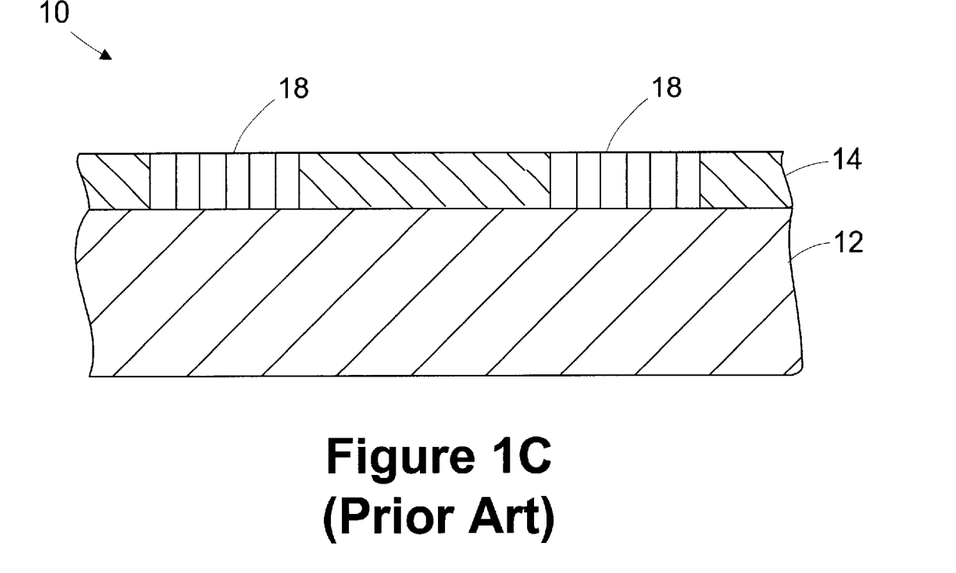
FIG. 1C is a cross-sectional view of the substrate of FIG. 1B after the substrate has been subjected to a post exposure bake process.
Figure 1D:
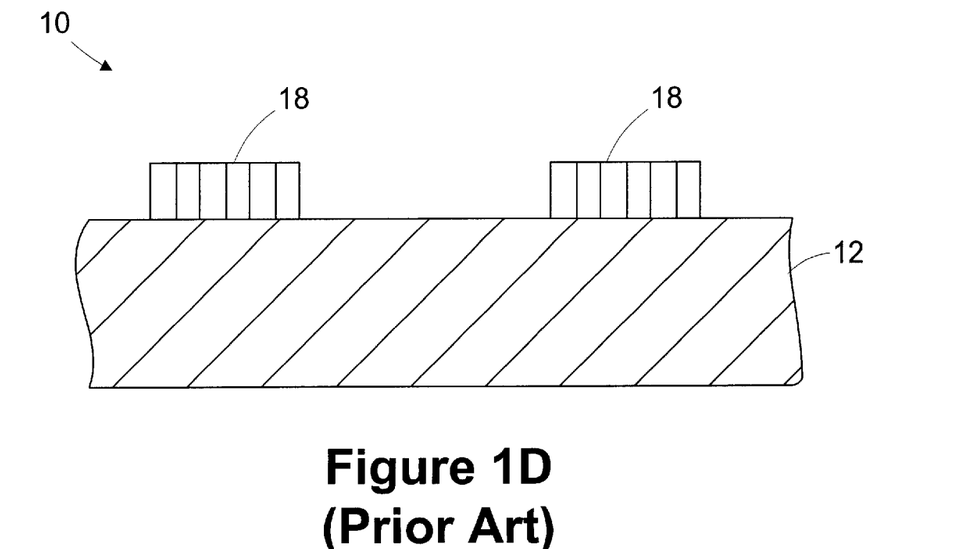
FIG. 1D is a cross-sectional of the substrate of FIG. 1B after the photoresist has been developed to remove the unexposed portions.

The process of using a chemically-amplified photoresist is described in greater detail in reference to FIGS. 1A through 1D. FIG. 1A shows a cross-sectional view of a wafer 10 including a base material 12 with a photoresist layer 14 deposited thereon. In FIG. 1B, the photoresist layer 14 is exposed to a light source through a photomask (not shown) to define exposed regions 16. Exposure to the light causes hydrogen free radicals to form in the exposed regions 16, which are on the surface of the photoresist layer 14. In FIG. 1C, the wafer 10 is subjected to a post exposure bake to complete the solubility transition chemical reaction and form baked regions 18. During the post exposure bake, the free radicals diffuse downward and react with the photoresist 14 beneath the exposed regions 16. Typically, for a deep ultraviolet photoresist layer 14, the post exposure bake time is about 60–90 seconds. As shown in FIG. 1D, a developer may then be applied to remove the remaining photoresist 14 (i.e., for a negative resist—shown in FIG. 1D) or to remove the baked portions 18 (ie., for a positive resist—not shown). The wafer 10 is then put through an ultraviolet (UV) baking process to further increase the resistivity of the photoresist 14 to any subsequent etching performed on the wafer 205. The remaining photoresist (ie., in the baked regions 18) is stripped using a process such as a plasma etch or a wet etch. A plasma strip tool uses plasma-enhanced, ionized oxygen/oxygen radicals. A wet etch tool typically uses sulfuric acid/peroxide mixes followed by rinses or a sequence of standard cleans.

The ultraviolet baking process is an important step in photolithography because it increases the cross-linking in the photoresist layer. As the amount of this cross-linking increases, the resistance to etching of the photoresist also increases, which is desirable for subsequent etching processes that are performed on the wafer. In addition to the cross-linking of bonds, the ultraviolet bake process also removes additional solvents from the photoresist layer, thereby further increasing its resistance to etching. As the photoresist material becomes more resistant to the etching process, however, it makes stripping off the photoresist more difficult to achieve. Accordingly, it is desirable for the photoresist to provide enough resistance to etching, yet not so much cross-linkage that the subsequent photoresist stripping process is difficult to achieve.

The present invention is directed to overcoming, or at least reducing the effects of, one or more of the problems set forth above.

SUMMARY OF THE INVENTION

In one aspect of the present invention, a method is provided for baking a wafer, with the wafer having a layer of photoresist thereon. A first thickness of the photoresist layer is measured, and a first fourier transform infrared (FTIR) spectra of the photoresist layer is generated. Based on the first thickness and first FTIR spectra, a bake time and bake temperature is determined. The wafer is then baked at the bake temperature for the bake time.

In another aspect of the present invention, an apparatus is provided for baking a wafer, where the wafer has a layer of photoresist thereon. The apparatus comprises an ellipsometer adapted to measure a first thickness of the photoresist layer and, a fourier transform infrared (FTIR) spectroscopy unit adapted to generate a FTIR spectra of the photoresist layer. A controller is also provided and adapted to determine a bake time and bake temperature based on the first thickness and first FTIR spectra. A bake unit is also provided and adapted to bake the wafer at the bake temperature for the bake time.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Figure 2:
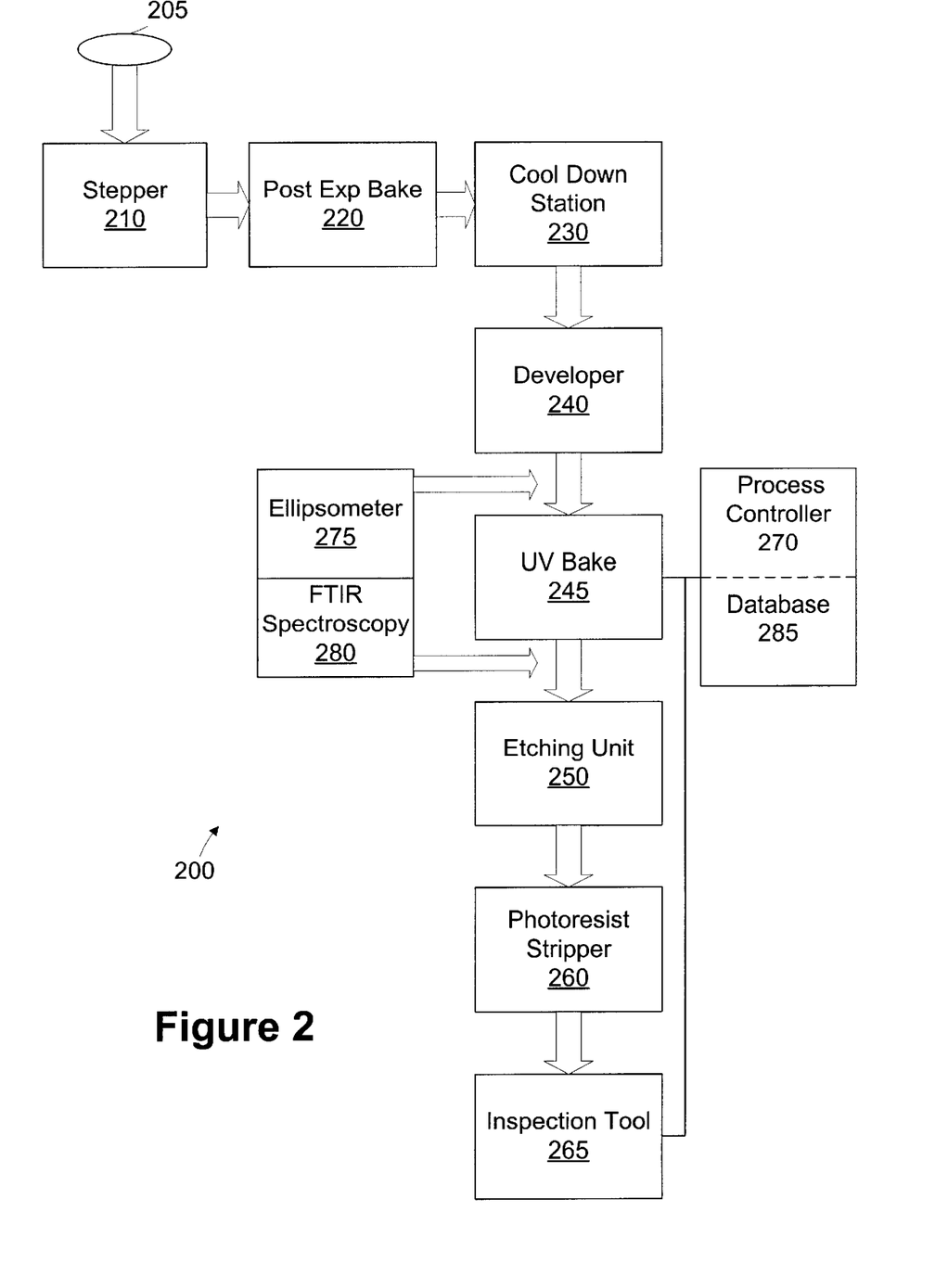
FIG. 2 is a simplified diagram of an illustrative processing line for performing ultraviolet baking of wafers in accordance with one embodiment.

Turning now to the drawings, and, specifically referring to FIG. 2, a simplified block diagram of a processing line 200 for performing photolithography patterning of a wafer 205 is provided. The processing line 200 includes a stepper 210 that exposes the photoresist layer on the wafer 205 to a light source using a photomask that forms a pattern thereon. The wafer 205 is subsequently transferred to a post exposure bake unit 220, where a post-exposure bake is conducted on the wafer 205.

Following the post exposure bake at the bake unit 220, the wafer 205 is transferred to a cool down station 230, and then to a developer 240, where the unexposed photoresist is removed. The wafer 205 is then transferred to an ultraviolet (UV) bake unit 245, where ultraviolet baking of the wafer 205 is conducted. The UV bake process improves the cross-linking of bonds in the photoresist layer of the wafer 205, thereby increasing the resistance of the photoresist to any subsequent etching performed on the wafer 205. The UV bake further removes additional solvents from the photoresist layer, thereby further increasing its resistance. Typically, there are several sources of variation that influence the degree of resistance in the photoresist layer to etching. They include the intensity of the UV light, duration of the UV bake, variation in the amount of solvents in the photoresist layer, variation in the photoresist resin, the actual thickness of the photoresist layer, etc.

The wafer 205 is placed in the UV bake unit 245 for a predetermined bake time, uv_bake_time, and is heated to a predetermined bake temperature, uv_bake temp. The present invention involves determining a desired uv_bake_time and uv_bake_temp parameters for the UV bake unit 245. This permits sufficient cross-linkage of bonds in the photoresist material of the wafer 205, thereby providing enough resistance for etching, yet not too much cross-linkage to make the photoresist stripping process difficult to achieve.

Following the UV bake at the UV bake unit 245, the wafer 205 is transferred to an etching unit 250 to etch the pattern formed by the photoresist onto the surface of the wafer 205. Following this etching step, the wafer 205 is transferred to a photoresist strip tool 260 where remnants of the patterned photoresist layer are removed. An inspection tool 265 is then used to confirm that the photoresist is completely stripped from the wafer 205.

In accordance with one embodiment of the present invention, a process controller 270 interfaces with at least the UV bake unit 245 to determine the optimal uv_bake_time and/or uv_bake_temp parameters based on quantitative and/or qualitative characteristics of the photoresist material residing on the wafer 205. In the illustrated embodiment, the process controller 270 determines the uv_bake_time and uv_bake_temp settings of the UV bake unit 245 according to the thickness of the photoresist layer on the wafer 205, as well as the amount of cross-linkage of bonds that exists within the photoresist material.

To optimize the uv_bake_time and uv_bake_temp parameters, prior to UV baking by the unit 245, an ellipsometer 275 is used to measure the thickness of the photoresist on the wafer 205. The thickness of the photoresist is determined prior to baking, and yields a prebake_thickness of the wafer 205. The manner in which the photoresist thickness is ascertained by the ellipsometer 275 is well within the knowledge of one of ordinary skill in the art. Accordingly, the specifics of such process will not be discussed herein to avoid unnecessarily obscuring the present invention. Further, it will be appreciated that other devices may be used in lieu of the ellipsometer to measure the thickness of the photoresist layer without departing from the spirit and scope of the present invention.

In addition to measuring the thickness of the photoresist layer, a fourier transform infrared (FTIR) spectroscopy unit 280 is used to measure the amount of cross-linking that exists in the photoresist material residing on the wafer 205. The FTIR spectroscopy unit 280 generates a FTIR_prebake_spectra before the wafer 205 undergoes the UV baking process by the bake unit 245. The manner in which the FTIR spectroscopy unit 280 generates the FTIR spectra is also well known to those of ordinary skill in the art, and the details of such are not discussed herein so as not to obscure the present invention.

Subsequent to baking the wafer 205 by the TV bake unit 245, the ellipsometer 275 is used again to measure the thickness of the photoresist layer on the wafer 205, which yields a postbake_thickness. Similarly, the FTIR spectra of the wafer 205 is obtained by the FTIR spectroscopy unit 280 after baking, and yields a FTIR_postbake_spectra of the wafer 205.

The desired uv_bake_time and uv_bake temp parameters of the UV bake unit 245 are determined based upon a collection of prior data obtained from batches or lots of wafers 205 that were previously processed by the processing line 200. To obtain this data, the ellipsometer 275 is used to determine the pre and post bake thicknesses of the photoresist (i.e., the parameters prebake_thickness and postbake_thickness), and the FTIR spectroscopy unit 280 is used to obtain the FTIR_prebake_spectra and FTIR_postbake spectra as previously discussed This data is stored along with the specific uv_bake_time and uv_bake_temp used for the particular lot of wafers 205 processed by the processing line 200. The data, according to one embodiment, may be stored in a database storage unit 285 at the process controller 270.

Figure 3:
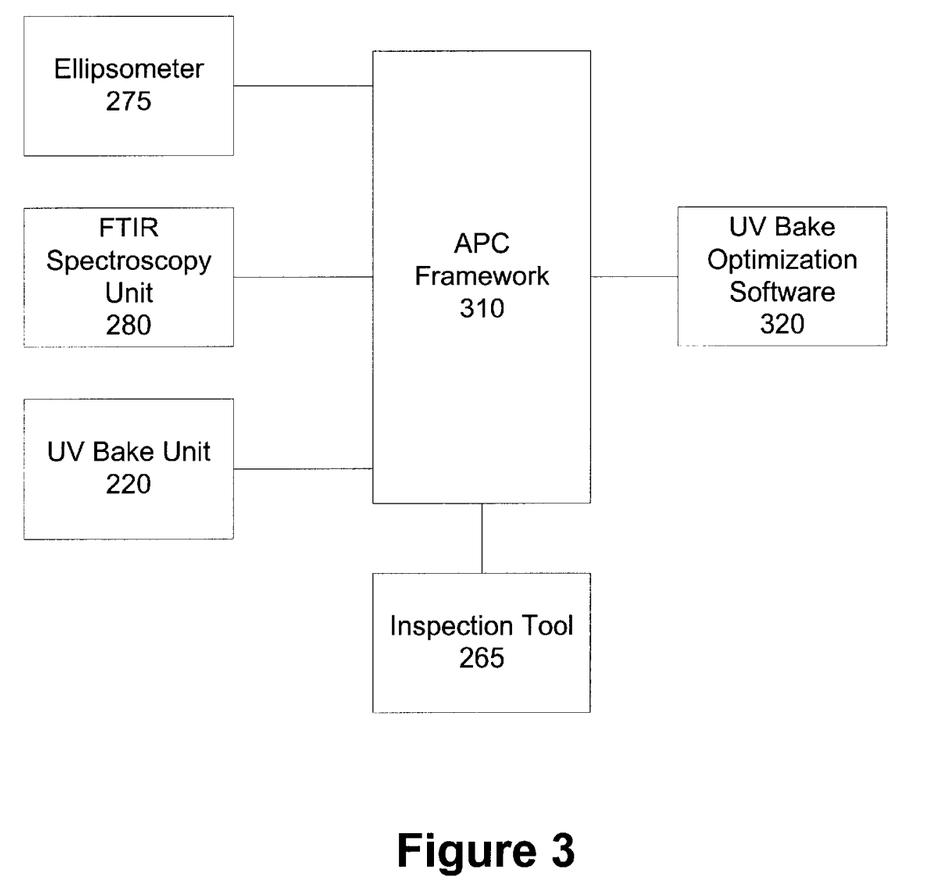
FIG. 3 is a simplified diagram for communicating data related to the ultraviolet baking of wafers over an Advanced Process Control (APC) framework in accordance with another embodiment.

In accordance with another embodiment, the UV bake unit 245, ellipsometer 275 and FTIR spectroscopy unit 280 may be coupled to an Advanced Process Control (APC) Framework 310 as shown in FIG. 3. In this embodiment, the functionality of the process controller 270 may be implemented in a UV bake optimization software unit 320. The ellipsometer 275 and FTIR spectroscopy unit 280 would respectively send the pre and postbake thickness measurements and pre and postbake FTIR spectra obtained from the processed wafers 205 to the UV bake optimization software 320 via the APC framework 310. The software 320, similar to the process controller 270 in the previous embodiment, determines the desired uv_bake_time and uv_bake_temp parameters based upon previously stored data The function of the APC framework 310 is fully described in U.S. patent application Ser. No. 09/393,176; entitled "Method and Apparatus For Integrating Near Real-Time Fault Detection in an APC Framework," by Michael Lee Miller, filed Sep. 9, 1999, and commonly assigned with the present application, the entire contents of which are incorporated herein by reference.

When a current lot of wafers 205 is processed by the processing line 200, the measurements for the photoresist thickness prebake_thickness is obtained by the ellipsometer 275, and the amount of cross-link in the photoresist FTIR_prebake_spectra for the lot is ascertained by the FTIR spectroscopy unit 280. These parameters for the current lot are compared by the process controller 270 to the stored data to determine the desired uv_bake_time and uv_bake_temp that yields a desired postbake_thickness and FTIR_postbake_spectra for the current lot of wafers 205 processed by the processing line 200. The uv_bake_time and uv_bake_temp settings for the UV bake unit 245 are accordingly adjusted to yield the desired post bake photoresist thickness and post bake FTIR spectra The collection of data pertaining to this current lot of wafers 205 is also stored along with the previously stored data to aid in determining the optimal UV bake time and temperature settings of subsequently processed wafers 205. By updating the database 285, the process controller 270 is able to better compensate for any variances that may occur in the processing line 200 over time.

Figure 4A:
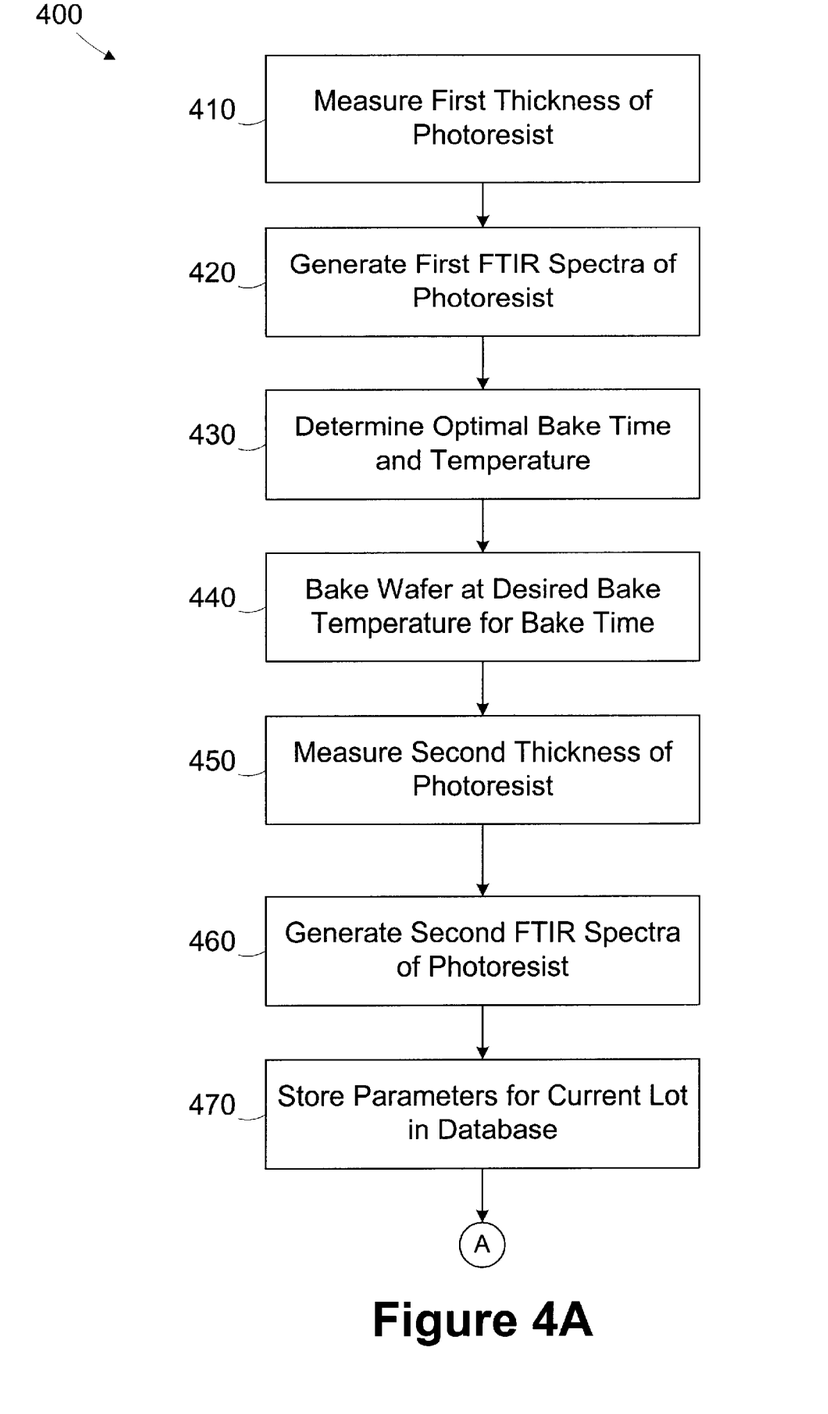
FIGS. 4A and 4B illustrate a process for determining optimal ultraviolet baking parameters in accordance with one embodiment of the present invention.
Figure 4B:
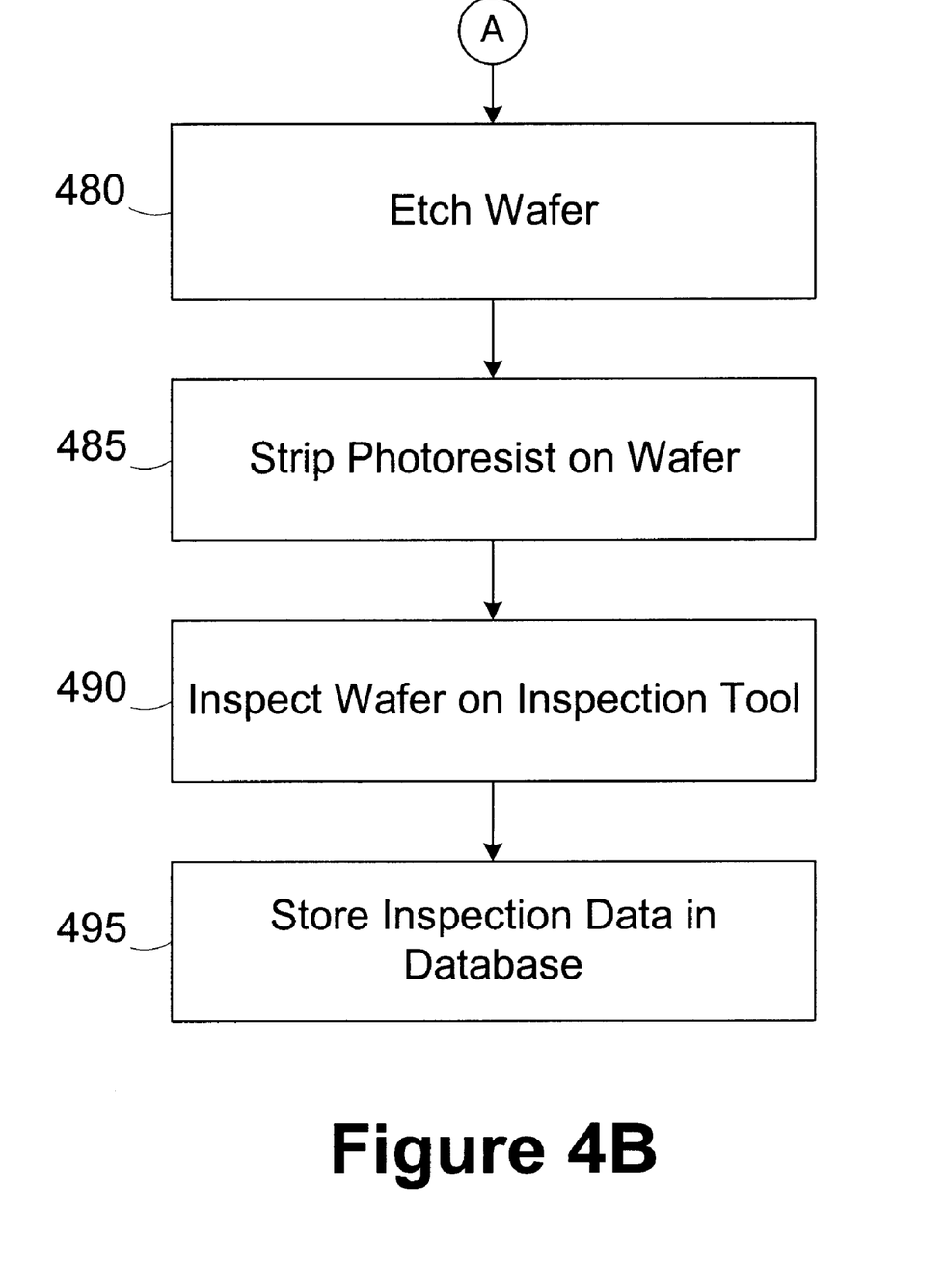

Turning now to FIGS. 4A and 4B, a process 400 for controlling the uv_bake_time and uv_bake_temp for a current lot of wafers 205 processed by the processing line 200 is provided. The process 400 commences at block 410 where the ellipsometer 275 determines the thickness of the photoresist material (prebake_thickness) for the current lot of wafers 205 prior to being sent to the UV bake unit 220 in the processing line 200. At block 420, the amount of cross-linking in the photoresist material is also determined for the current lot of wafers 205 by the FTIR spectroscopy unit 280, which yields an FTIR_prebake_spectra prior to baking the lot of wafers 205.

At block 430, the process controller 270 determines the desired uv_bake_time and uv_bake_temp based upon the stored data in the database 285 that was previously generated by lots of wafers 205 that were processed prior to the current lot. The prebake_thickness and FTIR_prebake_spectra for the current lot of wafers 205 respectively generated by the ellipsometer 275 and FTIR spectroscopy unit 280 is compared to the previously stored data in the database 285 to determine which uv_bake_time and uv_bake_temp parameters were used to yield the desired postbake_thickness and FTIR_postbake_spectra.

At block 440, the process controller 270 adjusts the settings of the UV bake unit 245 corresponding to the desired uv_bake_time and uv_bake_temp that were determined at block 430. Subsequent to baking the current lot of wafers 205 at the desired bake time and temperature, the ellipsometer 275 measures the postbake_thickness of the current lot of wafers 205 at block 450. Subsequent to determining the post bake thickness of the photoresist, the FTIR spectroscopy unit 280 measures the FTIR_postbake_spectra for the current lot of wafers 205 at block 460. Subsequently, at block 470, the newly obtained data for the current lot of wafers 205, including the uv_bake_time, uv_bake_temp, prebake_thickness, FTIR_prebake_spectra, postbake_thickness, and FTIR_postbake_spectra, is stored in the database 285 for later use when determining the optimal UV bake time and temperature by the process controller 270 for subsequently produced wafers 205.

At block 480, the wafer goes through an etching process, and at block 485 the photoresist on the wafer 205 is stripped away. Subsequently, the wafer 205 is inspected by the inspection tool 265 and the data obtained from the inspection tool 265 is stored in the database 285 at block 495. This data is then used for comparison with lots of wafers 205 that are subsequently processed.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method for baking a wafer, the wafer having a layer of photoresist thereon, the method comprising:

measuring a first thickness of the photoresist layer;

generating a first fourier transform infrared (FTIR) spectra of the photoresist layer,
the first spectra defining the degree of cross-linking of bonds in the photoresist layer;

determining a bake time and bake temperature based on the first thickness and first FTIR spectra; and baking the wafer at the bake temperature for the bake time.

2. The method of claim 1, further comprising:

measuring a second thickness of the photoresist layer after baking the wafer; and generating a second fourier transform infrared (FTIR) spectra of the photoresist layer after baking.

3. The method of claim 2, further comprising:

storing the first and second thicknesses and the first and second FTIR spectra in association with the determined bake time and temperature in a database, the stored first and second thicknesses, first and second FTIR spectra, bake time and temperature collectively forming stored data.

4. The method of claim 3, wherein determining a bake time and bake temperature based on the first thickness and first FTIR spectra further comprises:

comparing the first thickness and first FTIR spectra to the stored data in the database; and selecting the bake time and temperature that will yield a desired second thickness and second FTIR spectra once the wafer is baked.

5. A method for baking a wafer, the wafer having a layer of photoresist thereon, the method comprising:

measuring a first thickness of the photoresist layer;

measuring a first degree of cross-linking of bonds in the photoresist layer;

determining a bake time and bake temperature based on the first thickness and first degree of cross-linking; and baking the wafer at the bake temperature for the bake time.

6. The method of claim 5, further comprising:

measuring a second thickness of the photoresist layer after baking the wafer; and measuring a second degree of cross-linking of bonds in the photoresist layer.

7. The method of claim 6, further comprising:

storing the first and second thicknesses and the first and second degrees of cross-linking in association with the determined bake time and temperature in a database, the stored first and second thicknesses, first and second degrees of cross-linking, bake time and temperature collectively forming stored data.

8. The method of claim 7, wherein determining a bake time and bake temperature based on the first thickness and first degree of cross-linking further comprises:

comparing the first thickness and first degree of cross-linking to the stored data in the database; and selecting the bake time and temperature that will yield a desired second thickness and second degree of cross-linking once the wafer is baked.

* * * * *